US009298229B2

(12) United States Patent
Schelshorn et al.

(10) Patent No.: US 9,298,229 B2
(45) Date of Patent: Mar. 29, 2016

(54) FLOW-GUIDING HOOD FOR GUIDING A FLOW OF AIR

(75) Inventors: Lorenz Schelshorn, Augsburg (DE); Friedrich Köhler, Augsburg (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 74 days.

(21) Appl. No.: 14/353,905

(22) PCT Filed: Sep. 6, 2012

(86) PCT No.: PCT/EP2012/067415
§ 371 (c)(1),
(2), (4) Date: May 28, 2014

(87) PCT Pub. No.: WO2013/060519
PCT Pub. Date: May 2, 2013

(65) Prior Publication Data
US 2014/0293532 A1  Oct. 2, 2014

(30) Foreign Application Priority Data

Oct. 28, 2011  (DE) .......................... 10 2011 117 223

(51) Int. Cl.
*H05K 7/20* (2006.01)
*G06F 1/20* (2006.01)

(52) U.S. Cl.
CPC .............. *G06F 1/20* (2013.01); *H05K 7/20145* (2013.01); *H05K 7/20727* (2013.01)

(58) Field of Classification Search
CPC .................... H05K 7/20127–7/20145
See application file for complete search history.

(56) References Cited

U.S. PATENT DOCUMENTS

| 6,330,154 | B1 | 12/2001 | Fryers et al. |
| 6,657,860 | B2 * | 12/2003 | Matsui .................... G06F 1/203 165/121 |
| 7,342,786 | B2 * | 3/2008 | Malone ............. H05K 7/20727 165/104.33 |
| 7,408,773 | B2 * | 8/2008 | Wobig ...................... G06F 1/20 165/104.33 |
| 7,542,289 | B2 | 6/2009 | Tsai et al. |
| 7,589,973 | B2 | 9/2009 | Ong et al. |
| 7,817,417 | B2 * | 10/2010 | Franz ................. H05K 7/20145 361/679.49 |
| 8,300,409 | B2 * | 10/2012 | Wei ....................... F15D 1/0005 361/689 |
| 2003/0214782 | A1 * | 11/2003 | Osborn .............. H05K 7/20727 361/679.47 |

(Continued)

FOREIGN PATENT DOCUMENTS

| DE | 10 2005 063 024 | 7/2007 |
| JP | 2008-251067 | 10/2008 |
| JP | 2012-048050 | 3/2012 |

OTHER PUBLICATIONS

English translation of Japanese Notice of Reasons for Rejection dated Mar. 31, 2015 of corresponding Japanese Patent Application No. 2014-537535.

(Continued)

*Primary Examiner* — Gregory Thompson
(74) *Attorney, Agent, or Firm* — DLA Piper LLP (US)

(57) ABSTRACT

A flow-guiding hood that guides a flow of air in a computer or an electronic device includes a plurality of individual parts which includes a first flow-guiding element made of a substantially planar first material that channels the flow and at least one second flow-guiding element made of a different, second material and likewise channels the flow, wherein the second flow-guiding element rests on and/or is attached to the first flow-guiding element.

14 Claims, 2 Drawing Sheets

(56) References Cited

U.S. PATENT DOCUMENTS

| | | | |
|---|---|---|---|
| 2004/0022024 A1* | 2/2004 | Le | H05K 7/20727 361/695 |
| 2004/0095724 A1 | 5/2004 | Hsu | |
| 2005/0113016 A1 | 5/2005 | Shen et al. | |
| 2006/0232936 A1* | 10/2006 | Wu | H01L 23/34 361/704 |
| 2007/0053771 A1 | 3/2007 | Wu et al. | |
| 2007/0236882 A1* | 10/2007 | Chen | H05K 7/20154 361/695 |
| 2009/0046429 A1* | 2/2009 | Werner | H05K 7/20736 361/701 |
| 2010/0020487 A1 | 1/2010 | Lee et al. | |
| 2010/0105313 A1 | 4/2010 | Tsai et al. | |
| 2010/0130120 A1 | 5/2010 | Lee et al. | |
| 2010/0165568 A1 | 7/2010 | Tsai et al. | |
| 2010/0241278 A1* | 9/2010 | Brunschwiler | G06F 1/20 700/282 |
| 2011/0014861 A1 | 1/2011 | Tsai et al. | |
| 2011/0085303 A1 | 4/2011 | Peng et al. | |
| 2011/0182027 A1* | 7/2011 | Lima | G06F 1/20 361/679.46 |

OTHER PUBLICATIONS

Japanese Office Action dated Dec. 15, 2015 of corresponding Japanese Application No. 2014-537535 along with an English translation.

* cited by examiner

FLOW-GUIDING HOOD FOR GUIDING A FLOW OF AIR

TECHNICAL FIELD

This disclosure relates to a flow-guiding hood that guides the flow of air in a computer or other electronic device.

BACKGROUND

Such devices contain power-consuming electronic components that generate heat and therefore have to be cooled. Operating temperatures that are too high endanger, for example, the reliability of microprocessors or memory chips and shorten their service life.

Conventionally, cooling is effected by a blower or fan and heat-dissipating structures such as, for example, cooling fins, air-guiding hoods or compact heat-conductive metal structures in the immediate vicinity of individual chips. An air-guiding hood is a molded component that spatially restricts the air flow and thus controls it in a more specific manner, whether by channelling the exhaust air away from the components to be cooled or channelling the incoming air towards the components to be cooled.

Because of the in some cases very complex geometries of the optimized air ducts, the elements that guide the air are customarily produced in the form of compact injection molded parts of plastics material, the shaping being carried out with the aid of special plastics processing tools (molds etc.). This produces one-piece air-guiding hoods and shaped air-guiding parts tailored to the geometries and desired air-flow patterns in the computer.

But, as the internal construction in the computer becomes increasingly complex and/or as the desired air-flow patterns become increasingly refined, such a conventional flow-guiding hood becomes too expensive and too time-consuming to produce.

It could therefore be helpful to provide a flow-guiding hood that can be produced at significantly lower cost with the efficiency substantially unchanged.

SUMMARY

We provide a flow-guiding hood that guides a flow of air in a computer or an electronic device including a plurality of individual parts which includes: a first flow-guiding element made of a substantially planar first material that channels the flow and at least one second flow-guiding element made of a different, second material and likewise channels the flow, wherein the second flow-guiding element rests on and/or is attached to the first flow-guiding element.

We also provide an electronic device including the flow-guiding hood.

We further provide a computer including the flow-guiding hood.

LIST OF REFERENCE SIGNS

Figure 1:
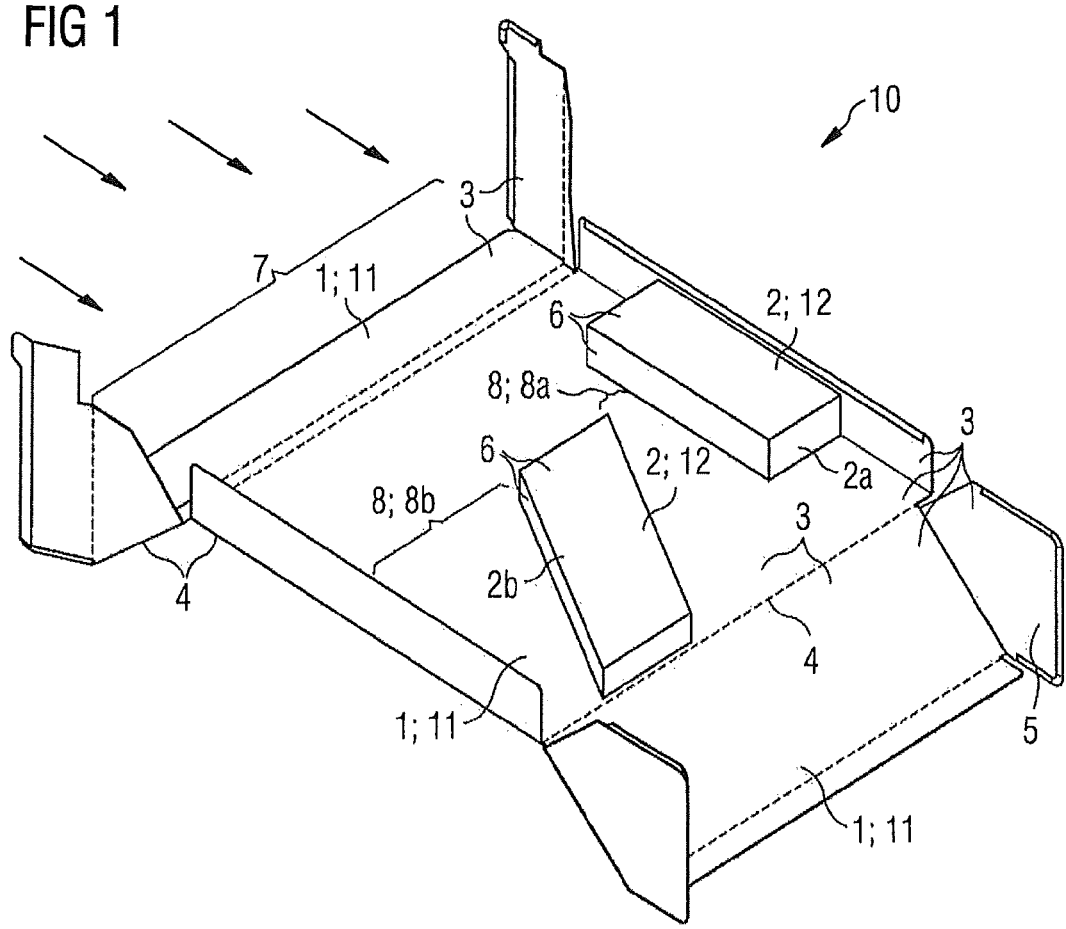
FIG. 1 schematically shows an example of a flow-guiding hood.

1 First flow-guiding element
2; 2, 2b Second flow-guiding element
3 Flat segment
4 Straight edge
5 First surface
6 Flat face
7 Main flow channel
8; 8a, 8b Part-flow channel
10 Flow-guiding hood
11 First material
12 Second material
13 Fan
14 Unit
15 Electronic device
20 Computer

DETAILED DESCRIPTION

Instead of being produced as a one-piece shaped part, our flow-guiding hoods are produced as a composite of multiple parts made of different materials. Thus, a first planar material such as sheet metal, for example, is used, which after being shaped (for instance by stamping, folding and/or bending) creates a rough, approximate flow pattern or flow edge. This first flow-guiding element is preferably punched, folded or bent such that it is composed of two-dimensional regions, each one flat and having straight edges. Further shaped parts made of the second material that serve for fine control the flow pattern can be mounted especially easily on such a first shaped part.

FIG. 1 shows in a perspective view an example of a flow-guiding hood 10 that guides the flow of air in a computer or other electronic device. The flow-guiding hood 10 is composed of a plurality of individual parts. A first flow-guiding element 1, which provides a main flow channel 7, is shaped from a planar first material 11, for example, from sheet metal, cardboard or a plastics material. The main flow channel 7 leads in FIG. 1 from left to right across the flow-guiding hood 10 shown in perspective. The main flow channel 7 is here bounded at least in one direction (for instance downwards) by the first flow-guiding element 1. In another direction (for instance upwards), the main flow channel 7 can be bounded, for example, by further elements inside the computer, but this is not absolutely necessary.

The first flow-guiding element 1 is preferably folded, punched or bent in some other way along a plurality of preferably straight edges 4, thus producing a plurality of flat, i.e. planar segments 3. The first flow-guiding element 1 can thus be made into the desired shape in a simple manner and can also be further subsequently processed in an especially easy manner. For that purpose, one or more second flow-guiding elements 2; 2a, 2b are provided, which serve for fine adjustment of the flow pattern. For example, FIG. 1 illustrates two such second flow-guiding elements 2a, 2b. They consist of a second material 12 that is preferably a volume material, for instance a compact mass or a foamed material. A foamed material in particular appears to be advantageous since it can be shaped in a simple manner, for instance, cut or sawed, without great consumption of material. The specific example of FIG. 1, according to which the first flow-guiding element 1 is bounded exclusively or predominantly by flat faces or flat pieces, has the particular advantage, in combination with the second flow-guiding elements 2, that the latter can be geometrically shaped in an especially simple manner and can be joined to the first flow-guiding element 1 in an especially simple manner. In the simplest case, this is achieved by adhesion over the whole area of one or more of the flat faces 6 of the particular second flow-guiding element 2 to a flat segment 3 of the first flow-guiding element 1. The second flow-guiding elements 2; 2a, 2b adhesively attached, for example, to the inside of the first flow-guiding element 1 enable, for example, a main flow channel 7 to be constricted, locally constricted or divided into several part-flow channels 8; 8a, 8b. Several second flow-guiding elements can also be bonded to one another or joined to each other in some other way. The first flow-guiding element 1 made of the planar material provides a main flow channel 7 further shaped by the second flow-guiding elements 2. Thus, both the first flow-guiding element 1 and the second flow-guiding elements 2; 2a, 2b actively channel air or another gaseous medium. All the second flow-guiding elements 2 are preferably located on the same face of the planar material 11 from which the first flow-guiding element 1 is made. The surface 5 of the first flow-guiding element provided with the second flow-guiding elements 2 is the inside of said flow-guiding element that encloses or partially encloses the flow channel.

The flow-guiding structure or flow-guiding hood 10 described here is suitable, for example, to feed an air flow between a fan and one or more units of a computer to be cooled with cooling air. Alternatively, such a flow-guiding hood 10 can be used to deflect the exhaust air from one or more units. Similarly, air that flows first through the flow-guiding hood before reaching the components or a fan can be extracted from the units by the fan.

Figure 2:
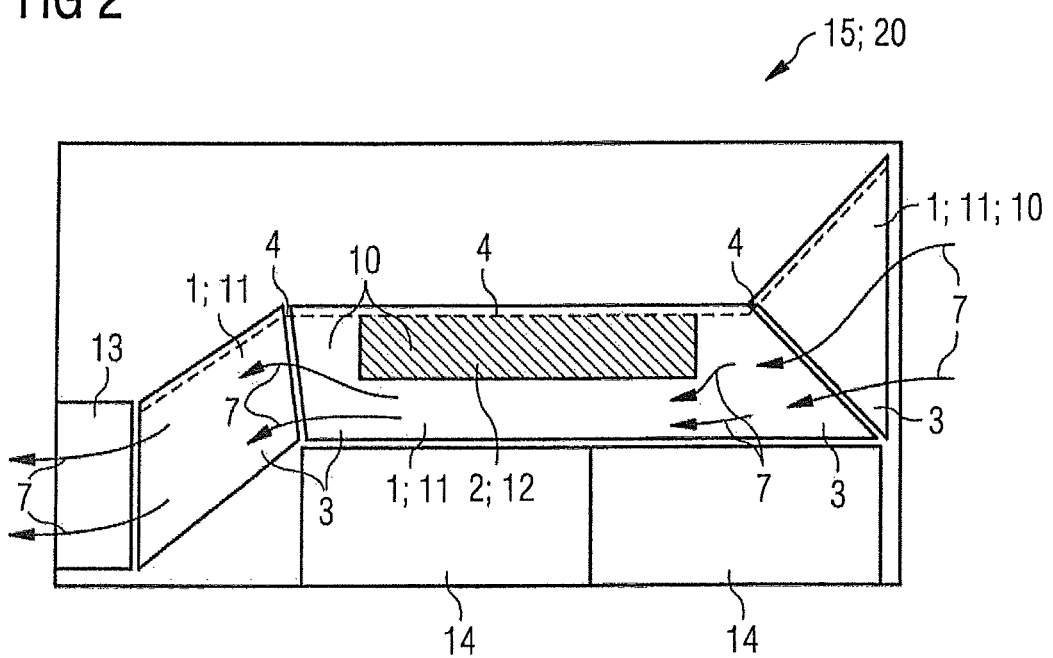
FIG. 2 schematically shows a computer with a flow-guiding hood inside it.

FIG. 2 schematically shows a cross section through a computer 20 or other electronic device 15 which is fitted with a flow-guiding hood 10. Two units 14 of the computer which require cooling and a fan 13 are indicated in the cross-sectional view. A flow-guiding hood 10 is installed in the computer 20 and constricts a main flow channel 7 and intensifies it in the region close to the units 14 to be cooled, as can be seen from the flow pattern indicated by arrows.

The flow-guiding hood 10 comprises a first flow-guiding element 1 made of a first material 11 such as, for example, a sheet metal, and at least one second flow-guiding element 2 made of a second material 12, for example, a foamed plastics material. The second flow-guiding element 2 is, for example, joined to the (downwardly facing but topmost) upper face of the middle portion of the first flow-guiding element 1. The height and course of the lateral walls of the first flow-guiding element 1 define within the plane of the drawing and perpendicular to the plane of the drawing the volume available for the main flow channel 7. The second flow-guiding element is, for example, of block-shaped construction or bounded in some other way by flat faces and yet further constricts the flow channel 7. As a result, in the immediate vicinity of the units 14, the flow rate of the air is even greater. The flow-guiding hood described here can be produced considerably more easily and is cheaper than a one-piece, shaped injection-molded part made of plastics material, and despite the simplest of basic shapes flow patterns can be controlled, for instance by oblique bounding surfaces of the first and/or second shaped part or by curved surfaces in particular of the second shaped parts made of the volume material.

Building on this principle the flow pattern can be further controlled by refining the shaping of the first and second flow-guiding element and by adding additional flow-guiding elements 2 made of the second material 12.

The invention claimed is:

1. A flow-guiding hood that guides a flow of air in a computer or an electronic device comprising a plurality of individual parts which comprises:
    a first flow-guiding element made of a substantially planar first material, shaped such that the first flow-guiding element is composed of two-dimensional regions, each of which are flat and have straight edges, and the first flow-guiding element that channels the flow by providing a main flow channel that causes a rough, approximate flow pattern, and
    at least one second flow-guiding element made of foamed plastics material as a different, second material and likewise channels the flow,
    wherein the second flow-guiding element rests on and/or is attached to the first flow-guiding element, and the second flow-guiding element finely controls the flow pattern.

2. The flow-guiding hood according to claim 1, wherein the second flow-guiding element is cut to size, punched or otherwise shaped such that it is defined predominantly by flat faces.

3. The flow-guiding hood according to claim 1, wherein the second flow-guiding element has one or more flat faces adhesively attached over a whole area thereof, to the first flow-guiding element.

4. The flow-guiding hood according to claim 1, wherein the planar material of the first flow-guiding element is foldable, bendable or deformable to form a plurality of flat segments.

5. The flow-guiding hood according to claim 1, wherein the planar material of the first flow-guiding element is a plastics sheet or, a sheet metal or cardboard.

6. The flow-guiding hood according to claim 1, wherein the first flow-guiding element is a punched shaped part.

7. The flow-guiding hood according to claim 1, wherein the first flow-guiding element is divided into a plurality of flat segments.

8. The flow-guiding hood according to claim 7, wherein the flat segments of the first flow-guiding element are differently oriented and are delimited from each other by bends, folds, perforations, punchings or by straight edges.

9. The flow-guiding hood according to claim 1, wherein the first flow-guiding element is shaped so that on a first surface it defines a main flow channel, and all of one or more second flow-guiding elements are attached on a same face of the planar first material of the main channel.

10. The flow-guiding hood according to claim 1, wherein one or more second flow-guiding elements are arranged on a same face of the first planar material of the main channel such that they locally constrict the main flow channel into a plurality of part-flow channels.

11. An electronic device comprising the flow-guiding hood according to claim 1.

12. A computer comprising the flow-guiding hood according to claim 1.

13. The flow-guiding hood according to claim 1, wherein one or more second flow-guiding elements are arranged on a same face of the first planar material of the main channel such that they locally divide the main flow channel into a plurality of part-flow channels.

14. A flow-guiding hood that guides a flow of air in a computer or an electronic device comprising a plurality of individual parts which comprises:
    a first flow-guiding element made of a substantially planar first material, shaped such that the first flow-guiding element is composed of two-dimensional regions, each of which are flat and have straight edges, and the first flow-guiding element that channels the flow by providing a main flow channel that causes a rough, approximate flow pattern, and
    at least one second flow-guiding element made of foamed plastics material as a different, second material and likewise channels the flow,
    wherein the second flow-guiding element rests on and/or is attached to the first flow-guiding element, and the second flow-guiding element finely controls the flow pattern, and both the first flow-guiding element and the at least one second flow-guiding element actively channel the flow pattern.

* * * * *